(12) United States Patent
Sun (10) Patent No.: US 11,475,812 B2
(45) Date of Patent: Oct. 18, 2022

(54) SHIFT REGISTER UNIT, SCAN DRIVING CIRCUIT, DRIVING METHOD THEREOF, AND DISPLAY APPARATUS

(71) Applicants: BEIJING BOE TECHNOLOGY DEVELOPMENT CO., LTD., Beijing (CN); BOE TECHNOLOGY GROUP CO., LTD., Beijing (CN)

(72) Inventor: Tuo Sun, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 425 days.

(21) Appl. No.: 16/618,261

(22) PCT Filed: May 17, 2019

(86) PCT No.: PCT/CN2019/087443
§ 371 (c)(1),
(2) Date: Nov. 29, 2019

(87) PCT Pub. No.: WO2020/119024
PCT Pub. Date: Jun. 18, 2020

(65) Prior Publication Data
US 2021/0335180 A1 Oct. 28, 2021

(30) Foreign Application Priority Data
Dec. 12, 2018 (CN) .......................... 201811520987.4

(51) Int. Cl.
*G11C 19/28* (2006.01)
*G09G 3/3266* (2016.01)
(Continued)

(52) U.S. Cl.
CPC ............... *G09G 3/20* (2013.01); *G11C 19/28* (2013.01); *G09G 3/3266* (2013.01);
(Continued)

(58) Field of Classification Search
CPC ..... G09G 3/3266; G09G 3/3674–3681; G09G 2310/0286
See application file for complete search history.

(56) References Cited

U.S. PATENT DOCUMENTS 7,932,887 B2 * 4/2011 Kim ........................ G11C 19/28
345/100
9,368,069 B2 * 6/2016 Woo ...................... G09G 3/3266
(Continued)

FOREIGN PATENT DOCUMENTS

CN 1428759 A 7/2003
CN 103927958 A 7/2014
(Continued)

OTHER PUBLICATIONS

International Search Report dated Sep. 20, 2019, issued in counterpart application No. PCT/CN2019/087443. (10 pages).

*Primary Examiner* — Patrick F Marinelli
(74) *Attorney, Agent, or Firm* — WHDA, LLP (57) ABSTRACT

The present disclosure relates to a shift register unit having a cascade input terminal, a cascade output terminal and a scan output terminal. The shift register unit may include a first shift circuit, a second shift circuit, an input circuit, and a control circuit. The input circuit may be configured to provide an input signal from the cascade input terminal to an input terminal of the first shift circuit under control of an input clock terminal. The control circuit may be configured to control connection of an output terminal of the first shift circuit and an input terminal of the second shift circuit based on a signal at a first control terminal.

17 Claims, 6 Drawing Sheets

(51) Int. Cl.
*G09G 3/36* (2006.01)
*G09G 3/20* (2006.01)

(52) U.S. Cl.
CPC ... *G09G 3/3677* (2013.01); *G09G 2300/0408* (2013.01); *G09G 2310/0267* (2013.01); *G09G 2310/0286* (2013.01); *G09G 2310/04* (2013.01)

(56) References Cited

U.S. PATENT DOCUMENTS

| | | | | |
|---|---|---|---|---|
| 9,454,934 | B2* | 9/2016 | Woo | G09G 3/3266 |
| 9,570,025 | B2* | 2/2017 | Liu | G09G 3/3677 |
| 10,937,369 | B2* | 3/2021 | Kang | G09G 3/3225 |
| 2003/0128180 | A1* | 7/2003 | Kim | G11C 19/00 |
| | | | | 345/100 |
| 2008/0001904 | A1* | 1/2008 | Kim | G11C 19/28 |
| | | | | 345/100 |
| 2010/0226473 | A1 | 9/2010 | Liu et al. | |
| 2012/0327131 | A1* | 12/2012 | Jang | G09G 3/3266 |
| | | | | 345/690 |
| 2014/0145924 | A1* | 5/2014 | Liu | G09G 3/3674 |
| | | | | 345/100 |
| 2015/0022428 | A1* | 1/2015 | Liu | G11C 19/28 |
| | | | | 345/76 |
| 2015/0035733 | A1* | 2/2015 | Woo | G09G 3/3266 |
| | | | | 345/76 |
| 2015/0061982 | A1* | 3/2015 | Woo | G11C 19/28 |
| | | | | 345/82 |
| 2015/0138180 | A1* | 5/2015 | Park | G09G 3/3233 |
| | | | | 345/212 |
| 2015/0187433 | A1 | 7/2015 | Zheng et al. | |
| 2017/0316751 | A1* | 11/2017 | Wang | G11C 19/184 |
| 2019/0096307 | A1 | 3/2019 | Liang et al. | |
| 2021/0335180 | A1* | 10/2021 | Sun | G09G 3/20 |

FOREIGN PATENT DOCUMENTS

| | | |
|---|---|---|
| CN | 107424554 A | 12/2017 |
| KR | 2006-0034059 A | 4/2006 |

* cited by examiner

SHIFT REGISTER UNIT, SCAN DRIVING CIRCUIT, DRIVING METHOD THEREOF, AND DISPLAY APPARATUS

CROSS-REFERENCE TO RELATED APPLICATIONS

This application claims benefit of the filing date of Chinese Patent Application No. 201811520987.4 filed on Dec. 12, 2018, the disclosure of which is hereby incorporated in its entirety by reference.

TECHNICAL FIELD

The present disclosure relates to display technology, in particular, to a shift register unit, a scan driving circuit, a driving method thereof, an a display apparatus.

BACKGROUND

Compared with a traditional process, the Gate Driver On Array (GOA) technology can not only save the circuit board carrying the gate driver and realize the symmetrical design on both sides of the display panel, but also save the chip bonding area at the edge of the display panel and the wiring area of the fan-out area, which is advantageous for realization of a narrow bezel design. At the same time, because GOA technology can eliminate the chip bonding process in the row direction, it will also greatly help the overall productivity and yield improvement.

BRIEF SUMMARY

One embodiment of the present disclosure provides a shift register unit having a cascade input terminal, a cascade output terminal and a scan output terminal. The shift register unit may include a first shift circuit, a second shift circuit, an input circuit, and a control circuit. The first shift circuit may have an input terminal, an output terminal coupled to the cascade output terminal, a first clock terminal, and a second clock terminal. The second shift circuit may have an input terminal, an output terminal coupled to the scan output terminal, a first clock terminal, and a second clock terminal. The input circuit may be coupled between the input terminal of the first shift circuit and the cascade input terminal, and may have an input clock terminal. The input circuit may be configured to provide an input signal from the cascade input terminal to the input terminal of the first shift circuit under control of the input clock terminal. The control circuit may be coupled between the output terminal of the first shift circuit and the input terminal of the second shift circuit, and may have a first control terminal. The control circuit may be configured to control connection of the output terminal of the first shift circuit and the input terminal of the second shift circuit based on a signal at the first control terminal.

Optionally, the shift register unit may further include a reset circuit, wherein the reset circuit is coupled to the input terminal of the second shift circuit and a second control terminal, respectively, and the reset circuit is configured to reset the input terminal of the second shift circuit under control of the second control terminal.

Optionally, the control circuit comprises a first transistor, a gate of the first transistor is coupled to the first control terminal, a first electrode of the first transistor is coupled to the output terminal of the first shift circuit, and a second electrode of the first transistor is coupled to the input terminal of the second shift circuit, wherein the first electrode and the second electrode are one of a source and a drain, respectively.

Optionally, the reset circuit comprises a second transistor, a gate of the second transistor is coupled to the second control terminal, a first electrode of the second transistor is coupled to a first signal terminal, and a second electrode of the second transistor is coupled to the input terminal of the second shift circuit; wherein the first electrode and the second electrode are one of a source and a drain, respectively.

Optionally, the first shift circuit comprises an output sub-circuit coupled to a pull-up node, an output node, and the second clock terminal of the first shift circuit, the output sub-circuit being configured to connect the output node with the second clock terminal of the first shift circuit under control of the pull-up node; wherein the pull-up node is coupled to the input terminal of the first shift circuit, and the output node is coupled to the output terminal of the first shift circuit; a pull-down control sub-circuit respectively coupled to the pull-up node, a pull-down node, and the first clock terminal of the first shift circuit, the pull-down control sub-circuit being configured to connect the first clock terminal of the first shift circuit and the pull-down node under control of the pull-up node, and pull up the pull-down node under control of the first clock terminal of the first shift circuit; and a pull-down sub-circuit respectively coupled to the pull-down node, the pull-up node, the output node, and the second clock terminal of the first shift circuit, the pull-down sub-circuit being configured to pull down the output node under control of the pull-down node, and pull down the pull-up node under control of both the pull-down node and the second clock terminal of the first shift circuit.

Optionally, the output sub-circuit comprises a third transistor and a first capacitor, a gate of the third transistor is coupled to the pull-up node, a first electrode of the third transistor is coupled to the output node, and a second electrode of the third transistor is coupled to the second clock terminal; and a first electrode of the first capacitor is coupled to the pull-up node, and a second electrode of the first capacitor is coupled to the output node; wherein the first electrode and the second electrode of the third transistor are one of a source and a drain, respectively.

Optionally, the pull-down control sub-circuit comprises a fourth transistor and a fifth transistor, a gate of the fourth transistor is coupled to the pull-up node, a first electrode of the fourth transistor is coupled to the first clock terminal of the first shift circuit, and a second electrode of the fourth transistor is coupled to the pull-down node, and a gate of the fifth transistor is coupled to the first clock terminal, a first electrode of the fifth transistor is coupled to the pull-down node, and a second electrode of the fifth transistor is coupled to a second signal terminal; wherein the first electrode and the second electrode are one of a source and a drain, respectively.

Optionally, the pull-down sub-circuit comprises a sixth transistor, a seventh transistor, an eighth transistor, and a second capacitor, a gate of the sixth transistor is coupled to the pull-down node, a first electrode of the sixth transistor is coupled to a the first signal terminal, and a second electrode of the sixth transistor is coupled to the output node, a gate of the seventh transistor is coupled to the pull-down node, a first electrode of the seventh transistor is coupled to the first signal terminal, and a second electrode of the seventh transistor is coupled to the first electrode of the eighth transistor, a gate of the eighth transistor is coupled to the second clock terminal of the first shift circuit, and the second electrode of the eighth transistor is coupled to the pull-up node, and the first electrode of the second capacitor is coupled to the first signal terminal, and the second electrode of the second capacitor is coupled to the pull-down node; wherein the first electrode and the second electrode of the sixth transistor, seventh transistor, and eighth transistor are one of a source and a drain, respectively.

Optionally, the first shift circuit and the second shift circuit have a same circuit structure.

Optionally, the input circuit comprises a ninth transistor, a gate of the ninth transistor is coupled to the first clock terminal of the first shift circuit, a first electrode of the ninth transistor is coupled to the input terminal of the input circuit, and a second electrode of the ninth transistor is coupled to the output terminal of the input circuit; wherein the first electrode and the second electrode are one of a source and a drain, respectively.

Optionally, the first clock terminal of the first shift circuit and the second clock terminal of the second shift circuit and the input clock terminal of the input circuit are coupled to a same clock, and the second clock terminal of the first shift circuit and the first clock terminal of the second shift circuit are coupled to a same clock.

One embodiment of the present disclosure is a method of driving a shift register unit, wherein the shift register unit is the shift register unit according to one embodiment of the present disclosure. The method includes providing a second level to the first control terminal when the first shift circuit provides a first level to its output terminal, thereby skipping refreshing of a pixel row corresponding to the shift register unit.

Optionally, the shift register unit comprises the reset circuit coupled to the input terminal of the second shift circuit and the second control terminal, respectively, the method further comprising providing a reset signal to the second control terminal so that a second level is provided to the input terminal of the second shift sub-circuit.

One embodiment of the present disclosure is a scan driving circuit, comprising a plurality of stages of shift register units, wherein each of the plurality of stages of the shift register units is the shift register unit according to one embodiment of the present disclosure. In odd-numbered stages of shift register units, the first clock terminal of the first shift circuit and the second clock terminal of the second shift circuit and the input clock terminal of the input circuit are coupled to a first clock signal, and the second clock terminal of the first shift circuit and the first clock terminal of the second shift circuit are coupled to a second clock signal. In even-numbered stages of shirt register units, the first clock terminal of the first shift circuit and the second clock terminal of the second shift circuit and the input clock terminal of the input circuit are coupled to the second clock signal, and the second clock terminal of the first shift circuit and the first clock terminal of the second shift circuit are coupled to the first clock signal.

Optionally, the cascade input terminal of the shift register unit of any one of the stages other than the first stage is coupled to the cascade output terminal of the shift register unit of the previous stage.

One embodiment of the present disclosure is a driving method of the scan driving circuit according to one embodiment of the present disclosure. The driving method includes providing a control signal to the first control terminal of each of the shift register units; wherein the control signal is at a first level in a corresponding data writing period of a previous row of each pixel row that needs to be refreshed, and the control signal is at a second level in a corresponding data writing period of a previous row of each pixel row that needs to be skipped refreshed.

Optionally, the control signal comprises a first control signal and a second control signal, and providing the control signal to each of the shift register units in the scan driving circuit comprises providing the first control signal to the shift register units of odd-numbered stages in each of the scan driving circuits, and providing the second control signal to the shift register units of even-numbered stages in each of the scan driving circuit; wherein the first control signal and the second control signal are inverted signals during a data writing period corresponding to a previous row of each pixel row that needs to be refreshed.

One embodiment of the present disclosure is a display apparatus comprising the scan driving circuit according to one embodiment of the present disclosure.

BRIEF DESCRIPTION OF THE DRAWINGS

The subject matter which is regarded as the disclosure is particularly pointed out and distinctly claimed in the claims at the conclusion of the specification. The foregoing and other objects, features, and advantages of the present disclosure are apparent from the following detailed description taken in conjunction with the accompanying drawings in which:

DETAILED DESCRIPTION

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-7. When referring to the figures, like structures and elements shown throughout are indicated with like reference numerals.

Unless otherwise defined, technical terms or scientific terms used in the present disclosure are intended to be in the ordinary meaning of those of ordinary skill in the art. The words "first," "second" and similar words used in the present disclosure do not denote any order, quantity or importance, but are merely used to distinguish different components. The words "including" or "comprising" and the like mean that the element or the item preceding the word includes the element or item listed after the word and its equivalent and do not exclude other components or objects. "Coupled" and the like are not limited to physical or mechanical connections, but may include electrical connections, whether direct or indirect. "Upper," "lower," "left," "right," etc. are only used to indicate the relative positional relationship. When the absolute position of the object being described is changed, the relative positional relationship may also change accordingly.

In the description of the following embodiments, specific features, structures, materials or characteristics may be combined in any suitable manner in any one or more embodiments or examples.

"Coupled" or "connected" and the like are not limited to physical or mechanical connections, but may include electrical connections, and the connections may be direct or indirect.

In the related art, the scan driving circuit based on the GOA technology occupies the frame width of the display apparatus. The more complicated the structure of the scan driving circuit, the larger the frame width occupied by the scan driving circuit. Thus, a narrow bezel design requires the structure of the scanning drive circuit to be as compact or simple as possible. Therefore, a simplified scan driving circuit in the related art can generally implement only a simple progressive scan function, and cannot perform, for example, a function of skipping scanning of a specified pixel row and refreshing only a portion of a display screen based on the simplified circuit structure.

Figure 1:
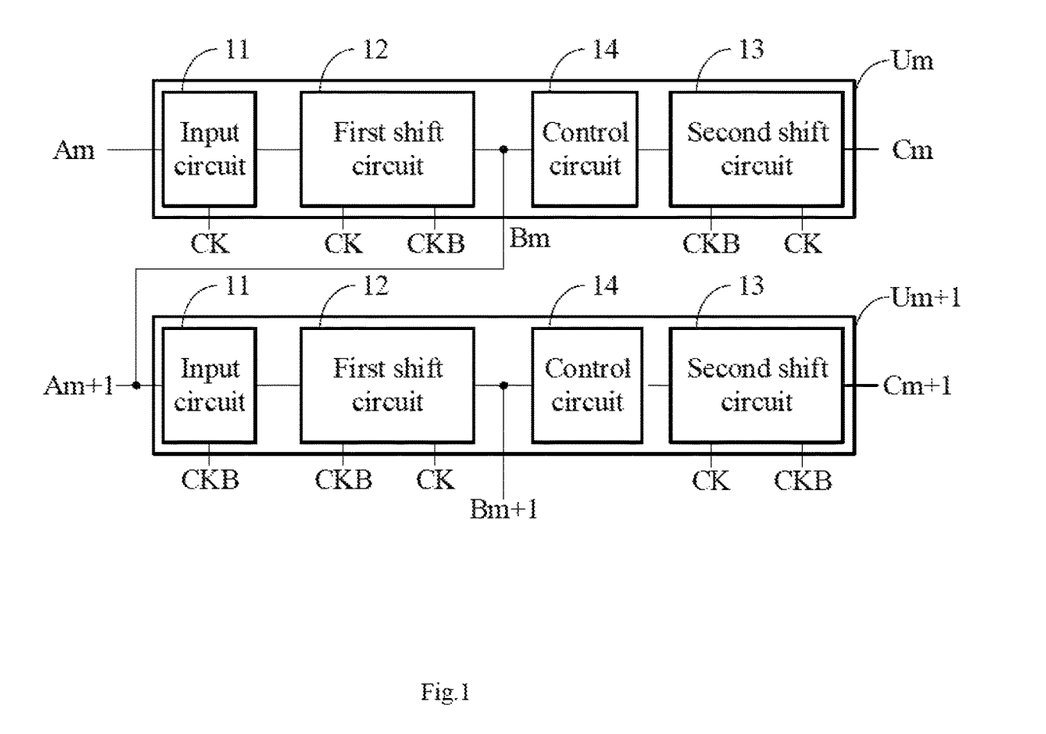
FIG. 1 is a structural block diagram of a shift register unit according to one embodiment of the present disclosure.

FIG. 1 is a structural block diagram of a shift register unit according to one embodiment of the present disclosure. As shown in FIG. 1, the shift register unit Um and the shift register unit Um+1 are shift register units of two adjacent stages in the scan driving circuit. It should be understood that the scan driving circuit is a circuit for respectively providing a gate scan signal to each row of pixels in the display apparatus, and each of the shift register units of a plurality of stages included therein respectively provides a gate scan signal for one row of pixels. As shown in FIG. 1, the shift register unit Um of the previous stage has a cascade input terminal Am, a cascade output terminal Bm, and a scan output terminal Cm. The shift register unit Um+1 of the subsequent stage has a cascade input terminal Am+1, a cascade output terminal Bm+1, and a scan output terminal Cm+1. The cascaded output terminal Bm of the shift register unit Um of the previous stage is connected to the cascade input terminal Am+1 of the shift register unit Um+1 of the subsequent stage. Thus, a cascade relationship between the shift register unit Um of the previous stage and the shift register unit Um+1 of the subsequent stage is formed. It should be understood that the shift register unit Um of the previous stage provides a gate scan signal through its cascade output terminal Bm. and the shift register unit Um+1 of the subsequent stage provides a gate scan signal through its cascaded output terminal Bm+1. Taking this as an example, the scan driving circuit may include a plurality of shift register units as shown in FIG. 1. Each two adjacent shift register units are coupled according to the cascade relationship shown in FIG. 1, thereby realizing the function of providing a gate scan signal to each row of pixels respectively.

As an example of a shift register unit Um, as shown in FIG. 1, the shift register unit Um includes an input circuit 11, a first shift circuit 12, a second shift circuit 13, and a control circuit 14.

In the shift register unit Um, the input terminal of the input circuit 11 is coupled to the cascade input terminal Am of the shift register unit Um. The input circuit 11 is configured to provide a first level to the output terminal of the input circuit 11 when the input terminal of the input circuit 11 and the first clock signal CK are respectively at a first level. In FIG. 1, the input terminals of the input circuit 11, the first shift circuit 12, and the second shift circuit 13 are at the left side thereof respectively, and the output terminals of the input circuit 11, the first shift circuit 12, and the second shift circuit 13 are at the right side thereof respectively. It should be noted that the first level and the second level herein refer to two different preset ranges of voltages for signals or circuit nodes, where the first level corresponds to "on" or "open" state (eg, corresponding to the state in which the transistor operates in the linear or saturated region), the second level corresponds to the "off" or "close" state (eg, the state in which the corresponding transistor operates in the cutoff region). In one embodiment, the first level is a low level and the second level is a high level. It should also be noted that the above "providing the first level" refers to making the voltage of the target signal or circuit node within the voltage range of the first level by, for example, providing an electrical signal, coupling with other signals, or coupling with other circuit nodes. Similar expressions can be understood with reference to the above description.

In the shift register unit Um, the input terminal of the first shift circuit is coupled to the output terminal of the input circuit 11, and the output terminal of the first shift circuit 12 is coupled to the cascade output terminal Bm of the shift register unit Um. The first clock terminal of the first shift circuit 12 (the lower left terminal of the first shift circuit 12 in FIG. 1) is coupled to the first clock signal CK, and the second clock terminal of the first shift circuit 12 (the lower right terminal of the first shift circuit 12 in FIG. 1) is coupled to the second clock signal CKB. The output terminal of the second shift circuit 13 is coupled to the scan output terminal Cm of the shift register unit Um, and the first clock terminal of the second shift circuit 13 (the lower left terminal of the second shift circuit 13 in FIG. 1) is coupled to the second clock signal CKB, and the second clock terminal of the second shift circuit 13 (the lower right terminal of the second shift circuit 13 in FIG. 1) is coupled to the first clock signal CK. The first shift circuit 12 and the second shift circuit 13 are each configured to provide a first level to the output terminal thereof when both the input terminal and the second clock terminal thereof are at a first level.

In the shift register unit Um, the control circuit 14 is respectively coupled to a first control terminal of the shift register unit Um (a terminal coupled to the control signal Shin FIG. 1), the output terminal of the first shift circuit 12, and the input terminal of the second shift circuit 13. The control circuit 14 is configured to control connection or disconnection between the output terminal of the first shift circuit 12 and the input terminal of the second shift circuit 13 based on the signal at the first control terminal. It should be noted that the first control terminal connected to the control circuit 14 does not necessarily need to be directly connected to the signal line for providing the control signal, and the control signal can also be received by, for example, a capacitor plate or an antenna.

It can be seen that, based on the structure of the shift register unit Um described above, the shift register unit Um can respectively provide a cascade output and a scan output to the cascade output terminal Bm and the scan output terminal Cm through the first shift circuit 12 and the second shift circuit 13, respectively (that is, providing a first level). Accordingly, when the coupling between the first shift circuit 12 and the second shift circuit 13 is disconnected by a control signal, the scan output of the corresponding line can be skipped. As such, the function of skipping scanning of a specified pixel row and refreshing only a portion of the image can be realized. Compared with the circuit structure that realizes the same function in the related art, the embodiment of the present disclosure does not need to introduce an additional chip or a circuit board, and can be realized by a simple circuit modification based on the circuit structure of the existing shift register unit. For example, only one shift circuit is added with reference to an existing shift circuit, and then a new control circuit is added between the two shift circuits to implement the embodiment of the present disclosure. Under the premise that the above functions are realized, the above-mentioned scan driving circuit and the display apparatus including the above-described scan driving circuit can support more functional characteristics, for example, by refreshing only a portion of the display screen to reduce power consumption. Therefore, the embodiment of the present disclosure can realize the function of skipping the scanning of the specified pixel row and refreshing only a portion of the screen with a simple circuit structure, thereby improving product performance of the scan driving circuit and the display apparatus.

In one embodiment, the first clock signal CK and the second clock signal CKB may be clock signals of the same period. When the first clock signal CK is at the first level, the second clock signal CKB is at the second level. When the second clock signal CKB is at a first level, the first clock signal CK is at a second level. In one embodiment, the first clock signal CK and the second clock signal CKB are inverted from each other. It should be noted that the first clock signal CK and the second clock signal CKB used by the shift register unit Um+1 are opposite to those used by the shift register unit Um. For example, referring to FIG. 1, the first clock terminal of the shift register unit Um+1 (the one terminal that supplies the clock signal to the input circuit 11, the first shift circuit 12, and the second shift circuit 13) is coupled to the second clock signal CKB, and the first clock terminal of the shift register unit Um is coupled to the first clock signal CK. Moreover, the second clock terminal of the shift register unit Um+1 (the one terminal that supplies the clock signal to the first shift circuit 12 and the second shift circuit 13) is coupled to the first clock signal CK, and the second clock terminal of the shift register unit Um is coupled to the second clock signal CKB. For a scan driving circuit including a plurality of shift register units of any of the above, the first clock signal CK and the second clock signal CKB used by any two adjacent shift register units in the scan driving circuit are opposite.

Figure 2:
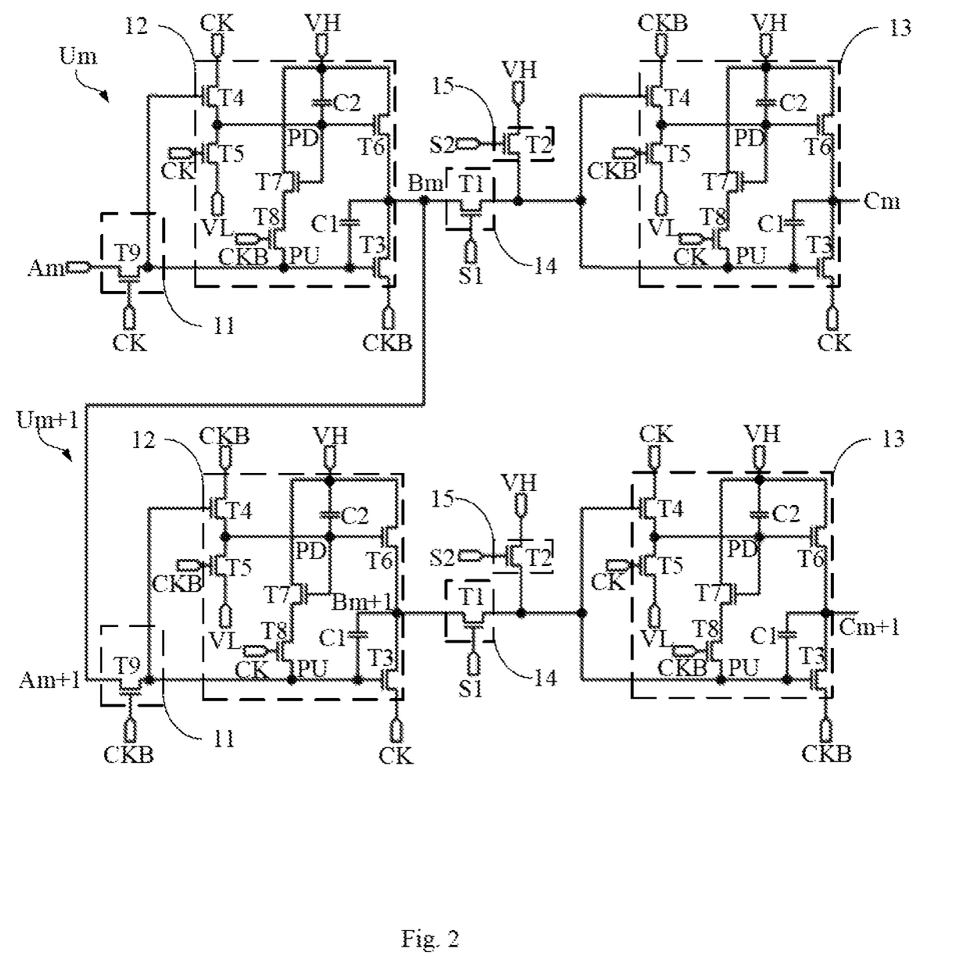
FIG. 2 is a schematic circuit diagram of a shift register unit according to one embodiment of the present disclosure.

FIG. 2 is a schematic diagram of circuit structures of shift register units according to one embodiment of the present disclosure. As shown in FIG. 2, the shift register unit Um and the shift register unit Um+1 are shift register units of two adjacent stages in the scan driving circuit. The shift register unit Um and the shift register unit Um+1 each include an input circuit 11, a first shift circuit 12, a second shift circuit 13, a control circuit 14, and a reset circuit 15. The optional structures of the shift register units will be described below by taking the shift register unit Um as an example.

In one embodiment, the control circuit 14 includes a first transistor T1. A gate of the first transistor T1 is coupled to the first control terminal (thereby receiving the control signal S1), and a first electrode of the first transistor T1 is coupled to the output terminal of the first shift circuit 12. In the shift register unit Um, the output terminal of the first shift circuit 12 is coupled to the cascade output terminal Bm of the shift register unit Um. The second electrode of the first transistor T1 is coupled to the input terminal of the second shift circuit 13. The first transistor T1 can turn on the connection between the output terminal of the first shift circuit 12 and the input terminal of the second shift circuit 13 when the control signal S1 provides a first level as a gate turn-on voltage (eg, a voltage that causes the first transistor T1 to operate in a linear region or a saturation region). When the control signal S1 provides a second level as a gate-off voltage (eg, a voltage that causes the first transistor T1 to operate in the cut-off region), the first transistor T1 can break the connection between the output terminal of the first shift circuit 12 and the input terminal of the second shift circuit 13. It should be noted that the first electrode and the second electrode are respectively one of a source and a drain. According to different types of transistors, a coupling relationship of a source and a drain of the transistor may be separately set to match the direction of the current flowing through the transistor. When the transistor has a symmetrical structure of the source and the drain, the source and the drain can be regarded as two electrodes that are not particularly distinguished.

In one embodiment, the reset circuit 15 includes a second transistor T2. A gate of the second transistor T2 is coupled to the second control terminal of the shift register unit Um, thereby receiving the reset signal S2. A first electrode of the second transistor T2 is coupled to a first signal terminal VH providing a second level, and a second electrode of the second transistor T2 is coupled to the input terminal of the second shift circuit 13. When the reset signal S2 supplies the first level as a gate turn-on voltage (for example, a voltage that causes the second transistor T2 to operate in the linear region or the saturation region), the second transistor T2 supplies a second level to the input terminal of the second shift circuit 13 through the first signal terminal VH. It should be understood that the second level refers to a second level for the input terminal of the second shift circuit 13. Taking this as an example, the reset circuit 15 can realize the function of providing the second level to the input terminal of the second shift circuit 13 when the received reset signal S2 is at the first level by any means. The reset circuit 15 is capable of resetting the input terminal of the second shift circuit 13 under the control of the reset signal S2, thereby contributing to improving the stability of the potential of the input terminal of the second shift circuit 13, and preventing the shift register unit from generating false output of the first level at the output terminal due to noise interference.

In one embodiment, the input circuit 11 in the shift register unit Um includes a ninth transistor T9. A gate of the ninth transistor T9 is coupled to the first clock terminal of the shift register unit Um (thereby receiving the first clock signal CK). A first electrode of the ninth transistor T9 is coupled to the input terminal of the input circuit 11 (the input terminal of the first shift circuit 12 is coupled to the cascade input terminal Am of the shift register unit Um), and a second electrode of the ninth transistor T9 is coupled to the output terminal of the input circuit 11 (the output terminal of the input circuit 11 is coupled to the input terminal of the first shift circuit 12). The ninth transistor T9 is capable of turning on the connection between the input terminal and the output terminal of the input circuit 11 when the first clock signal CK provides a first level as agate-on voltage (eg, a voltage that causes the ninth transistor T9 to operate in a linear region or a saturation region). That is, the connection between the cascade input terminal Am of the shift register unit Urn and the input terminal of the first shift circuit 12 can be turned on. Thus, the ninth transistor T9 can provide the first level to the input terminal of the first shift circuit 12 when the cascade input terminal Am is at the first level. It should be understood that a circuit configuration capable of providing a first level to the output terminal of the input circuit 11 when the input terminal of the input circuit 11 and the first clock signal CK are at the first level may not be limited to the above example. In one example, the gate of the ninth transistor T9 is coupled to the cascade input terminal Am, the first electrode of the ninth transistor T9 is coupled to the cascade input terminal Am, and the second electrode of the ninth transistor T9 is coupled to the output terminal of the input circuit 11. Thus, when the cascade input terminal Am is at the first level, the ninth transistor T9 operating in the linear region or the saturation region can provide the first level to the output terminal of the input circuit 11. That is, the above input circuit 11 can also be implemented.

The first shift circuit 12 and the second shift circuit 13 may have the same circuit structure. The optional circuit structure of the first shift circuit 12 and the second shift circuit 13 will be described below by taking the first shift circuit 12 in the shift register unit Um as an example. The first shift circuit 12 and the second shift circuit 13 in the shift register unit Um each include an output sub-circuit (including a third transistor T3 and a first capacitor C1), and a pull-down control sub-circuit (including a fourth transistor T4 and a fifth transistor T5), and a pull-down sub-circuit (including a sixth transistor T6, a seventh transistor T7, an eighth transistor T8, and a second capacitor C2).

In one embodiment, in the output sub-circuit, the gate of the third transistor T3 is coupled to the pull-up node PU (the input terminal of the first shift circuit 12 or the second shift circuit 13), and the first electrode of the third transistor T3 is coupled to the output node (the output terminal of the first shift circuit 12 or the second shift circuit 13), the second electrode of the third transistor T3 is coupled to the second clock terminal of the first shift circuit 12. The first clock terminal of the first shift circuit 12 is connected to the first clock signal CK, and the second clock terminal thereof is connected to the second clock signal CKB. When the pull-up node PU is at the first level, the third transistor T3 operating in the linear region or the saturation region can turn on connection between the output node and the second clock terminal. It can be seen that the output sub-circuit is respectively coupled to the pull-up node PU, the output node, and the second clock terminal of the first shift circuit 12, and can turn on the connection between the output node and the second clock terminal of the first shift circuit 12 when the pull-up node PU is at the first level. In addition, on the one hand, the first capacitor C1 can help achieving self-boosting. On the other hand, the first capacitor Clean help stabilize the level at the pull-up node PU and the level at the output node.

In the pull-down control sub-circuit, the gate of the fourth transistor T4 is coupled to the pull-up node PU, the first electrode of the fourth transistor T4 is coupled to the first clock terminal, and the second electrode of the fourth transistor T4 is coupled to the pull-down node PD. The gate of the fifth transistor T5 is coupled to the first clock terminal, the first electrode of the fifth transistor T5 is coupled to the pull-down node PD, and the second electrode of the fifth transistor T5 is coupled to the second signal terminal VL that provides the first level. When the pull-up node PU is at the first level, the fourth transistor T4 operating in the linear region or the saturation region may turn on connection between the first clock terminal and the pull-down node PD. When the first clock terminal of the first shift circuit 12 is at the first level, the fifth transistor T5 operating in the linear region or the saturation region can provide the first level to the pull-down node PD through the second signal terminal VL. It can be seen that the pull-down control sub-circuit is respectively coupled to the pull-up node PU and the first clock terminal of the first shift circuit 12, and can turn on the connection between the first clock terminal of the first shift circuit and the pull-down node PD when the pull-up node PU is at the first level. Furthermore, the pull-down control sub-circuit can provide a first level to the pull-down node PD when the first clock terminal of the first shift circuit 12 is at the first level.

In the pull-down sub-circuit, a gate of the sixth transistor T6 is coupled to the pull-down node PD, a first electrode of the sixth transistor T6 is coupled to the first signal terminal VH that provides a second level, and a second electrode of the sixth transistor T6 is coupled to the output node. A gate of the seventh transistor T7 is coupled to the pull-down node PD, a first electrode of the seventh transistor T7 is coupled to the first signal terminal VH that provides the second level, and a second electrode of the seventh transistor T7 is coupled to the first electrode of the eighth transistor T8. A gate of the eighth transistor T8 is coupled to the second clock terminal of the first shift circuit 12, a first electrode of the eighth transistor T8 is coupled to the first electrode of the seventh transistor T7, and a second electrode of the eighth transistor T8 is coupled to the pull-up node PU. The first electrode of the second capacitor C2 is coupled to the first signal terminal VH that provides the second level, and the second electrode of the second capacitor C2 is coupled to the pull-down node PD. When the pull-down node PD is at the first level, the sixth transistor T6 operating in the linear region or the saturation region can provide the second level to the output node through the first signal terminal VH. It can be seen that the pull-down sub-circuit is respectively coupled to the pull-down node, the pull-up node, the output node, and the second clock terminal of the first shift circuit 12, and can provide a second level to the output node when the pull-down node is at the first level and provide a second level to the pull-up node when both the pull-down node and the second clock terminal of the first shift circuit 12 are at a first level. The second capacitor C2 can function to stabilize the potential at the pull-down node PD.

Figure 3:
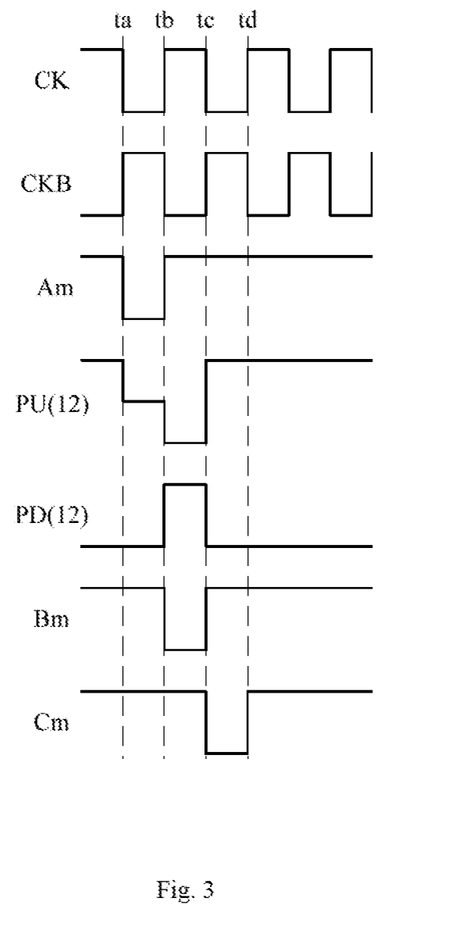
FIG. 3 is a circuit operation timing diagram of a first shift circuit in a shift register unit according to one embodiment of the present disclosure.

FIG. 3 is a circuit operation timing diagram of a first shift circuit in a shift register unit according to one embodiment of the present disclosure. An example of the workflow of the first shift circuit 12 in the shift register unit Um of FIG. 2 will be described below with reference to FIG. 3. It should be noted that, except for special explanation, in the following description, the first level is a low level and the second level is a high level.

Referring to in FIGS. 2 and 3, in the periods before the first time ta and after the fourth time td: the fifth transistor T5 and the eighth transistor T8 are alternately turned on as the periods of the first clock signal CK and the second clock signal CKB are alternately turned on (the turned-on state may be, for example, a state operating in a linear region or a saturated region). Thereby, the level of the pull-down node PD can be kept low, so that the sixth transistor T6 and the seventh transistor 17 remain turned on, and the level of the pull-up node PU and the level of the cascade output terminal Bm are kept high. The third transistor T3 and the fourth transistor T4 remain turned off (the Off state may be, for example, a state of operating in the cutoff region).

Referring to FIG. 2 and FIG. 3, between the first time ta and the second time tb: the first clock signal CK and the input terminal Am of the shift register unit Um are both at low level, and the ninth transistor T9 in the input circuit 11 is turned on, thereby causing the level at the pull-up node PU to go low. At this time, the third transistor T3 and the fourth transistor T4 are turned on, the pull-down node PD is connected with the first clock signal CK, and the cascade output terminal Bm is connected with the second clock signal CKB, so that the pull-down node PD is kept at a low level, and the output terminal Bm is kept at a high level. The sixth transistor T6 and the seventh transistor T7 are turned on, and the first capacitor C1 is charged.

Referring to FIG. 2 and FIG. 3, between the second time tb and the third time tc: the first clock signal CK is turned to a high level, and the second clock signal CKB is turned to a low level. At this time, under the action of the third transistor T3 and the first capacitor C1, the level at the cascade output terminal Bm is turned to a low level (first level), and the level at the pull-up node PU is lowered to a lower level (ie, bootstrap). Thus, the third transistor T3 and the fourth transistor T4 remain turned on, the sixth transistor T6 and the seventh transistor T7 are turned off, and the pull-down node PD that is turned on with the first clock signal CK is turned to a high level.

Referring to FIG. 2 and FIG. 3, between the third time tc and the fourth time td: the first clock signal CK is turned to a low level, the second clock signal CKB is turned to a high level, and the fifth transistor T5 is turned on, and the pull-down node PD that is turned on with the first clock signal CK is turned to a low level. Thereby, the sixth transistor T6 and the seventh transistor T7 are turned on, and the cascade output terminal Bm that is turned on with the first signal terminal VH is turned to a high level. During this period, the turned-on ninth transistor T9 turns on the input terminal Am and the pull-up node PU, so that the pull-up node PU is turned to a high level, and the third transistor T3 and the fourth transistor T4 are turned off. Thereby, the first shift circuit 12 returns to the state before the first time ta. That is, the reset of the first shift circuit 12 is completed.

For simplicity, the period between the first time ta and the second time tb is referred to as an input phase of the first shift circuit 12. The period between the second time tb and the third time tc is referred to as an output phase of the first shift circuit 12. The period between the third time tc and the fourth time td is referred to as a reset phase of the first shift circuit 12. It can be inferred analogously that in the case where the control signal S1 is at a low level, the period between the second time tb and the third time tc is also the input phase of the second shift circuit 13 (The first transistor T1 supplies a low level to the pull-up node PU of the second shift circuit 13 through the cascade output terminal Bm). The period between the third time tc and the fourth time td is also an output phase of the second shift circuit 13 (the scan output terminal Cm that is turned on with the first clock signal CK is turned to a low level). Thus, the cascade output and the scan output can be completed by the first shift circuit 12 and the second shift circuit 13 respectively in accordance with the above timing diagram.

On this basis, an alternative implementation of skipping the scan output of the corresponding row through the control signal will be illustrated below.

Figure 4:
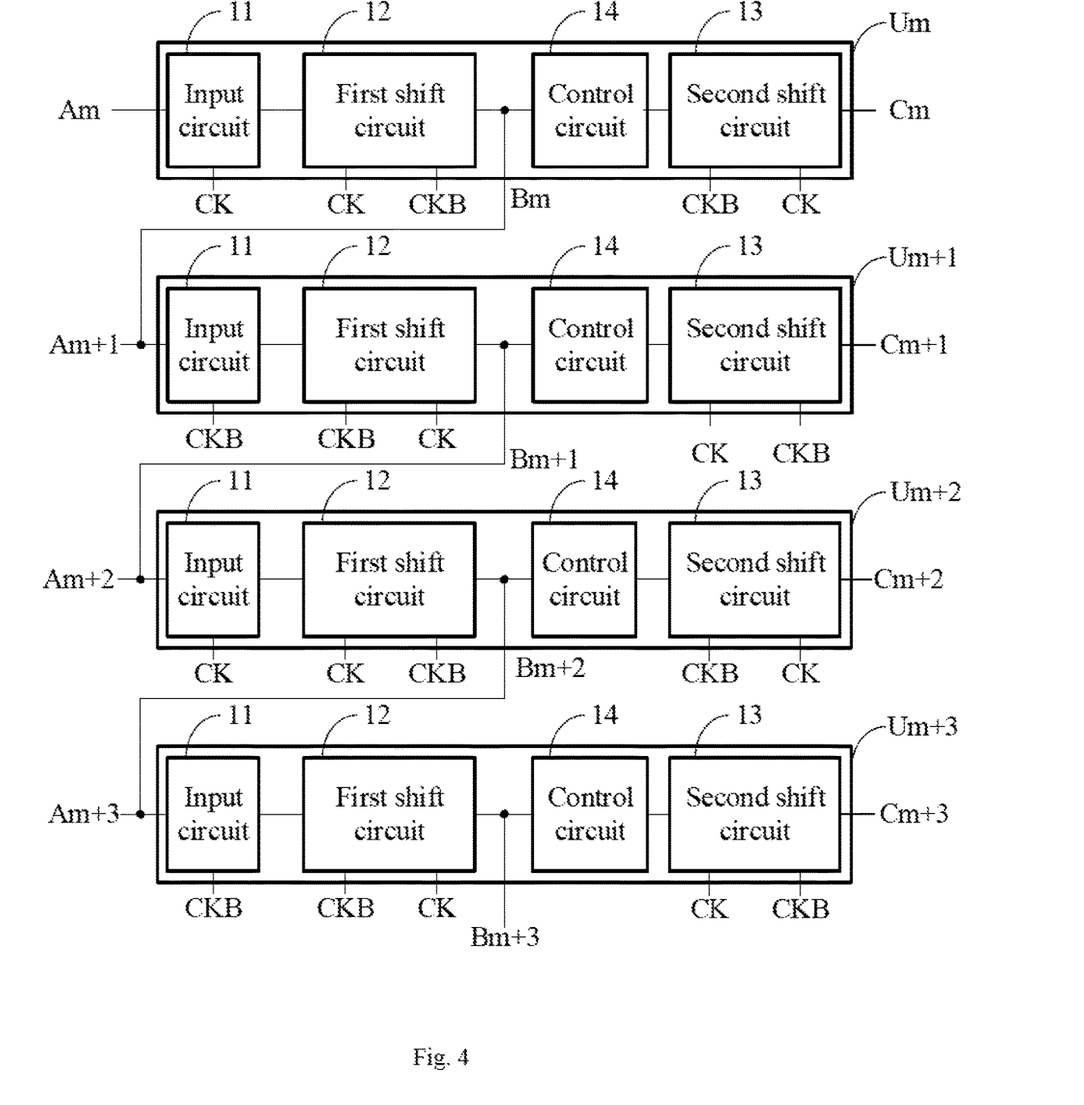
FIG. 4 is a schematic structural diagram of a scan driving circuit according to one embodiment of the present disclosure.

FIG. 4 is a schematic structural diagram of a scan driving circuit according to one embodiment of the present disclosure. Referring to FIG. 4, the scan driving circuit includes a plurality of stages of cascaded shift register units. In FIG. 4, the shift register unit Um, the shift register unit Um+1, the shift register unit Um+2, and the shift register unit Um+3 which are cascaded are taken as an example. The cascading relationship between any adjacent two stages of shift register units in the scan driving circuit is as described above. In one example, the cascade input terminal of the shift register unit of the first stage is coupled to a frame start signal (STV), and the cascade input terminal of the shift register unit of any stage other than the first stage of the scan drive circuit is coupled to the cascade output terminal of the shift register unit of the previous stage. The first clock signal CK and the second clock signal CKB used by the odd-numbered stages of shift register units are opposite to those used by the even-numbered stages of shift register units respectively.

Figure 5:
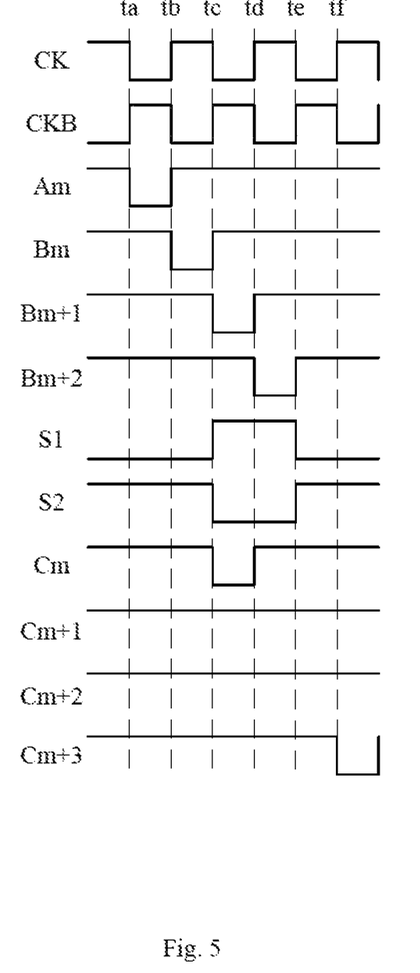
FIG. 5 is a circuit timing diagram of a scan driving circuit according to one embodiment of the present disclosure; FIG.

FIG. 5 is a circuit timing diagram of a scan driving circuit according to one embodiment of the present disclosure. Referring to FIGS. 4 and 5, as described above, the shift register unit Um can implement, under the input of the signals at the first clock signal CK, the second clock signal CKB, and the cascade input terminal Am as shown in FIG. 5, output of the signals at the cascade output terminal Bm and the scan output terminal Cm are as shown in FIG. 5. Likewise, other shift register units can implement similarly as the shift register unit Um. Referring to FIGS. 2, 4, and 5, the control signal S1 is at a high level (a second level of the control signal S1) between the third time tc and the fifth time te, and is at a low level in other periods. Therefore, between the third time tc and the fifth time te, the coupling between the cascade output terminal of each stage of the shift register unit and the pull-up node PU of the second shift circuit 13 thereof is disconnected, so that the pull-up node PU of the second shift circuit 13 thereof cannot turn to a low level during this period. Then, the second shift circuits 13 in the shift register unit Um+1 and the shift register unit Um+2 do not enter the above input stage, and the corresponding scan output terminal Cm+1 and scan output terminal Cm+2 do not generate a scan output (the shift register unit Um+3 is not affected by this). Thus, the output skipping the two pixel rows corresponding to the shift register unit Um+1 and the shift register unit Um+2 is realized. Further, between the third time tc and the fifth time te, the reset signal S2 is at a low level (first level). Therefore, the second transistor T2 turned on in each shift register unit can supply a high level to the pull-up node PU of the second shift circuit 13 through the signal line VH, thereby stabilizing the potential of the pull-up node PU of each of the second shift circuits 13 at this time and avoiding false output caused by noise interference.

It can be seen that for any positive integer m, if it is necessary to skip the refreshing of the m+1th pixel row, a second level (high level) is provided to the control signal S1 in the period in which the shift register unit Um of the mth row performs the scan output (ie, the period in which the scan output terminal Cm is the low level, that is, the data write period of the mth pixel row). On the other hand, if it is not necessary to skip the refreshing of the m+1th pixel row, a first level (low level) is provided to the control signal S1 in the period in which the shift register unit Um of the mth row performs the scan output (ie. the period in which the scanning output terminal Cm is the low level, that is, the data writing period of the mth pixel row).

It can be seen that the driving method of the scan driving circuit may include: providing a control signal to each shift register unit in the scan driving circuit. The control signal is at a first level in a corresponding data writing period of a previous row of each pixel row that needs to be refreshed. The control signal is at a second level in a corresponding data writing period of a previous row of each pixel row that needs to be skipped refreshed. In addition, if it is necessary to skip the refresh of the pixel row of the first row, the coupling between the frame start signal and the scan driving circuit may be disconnected and/or a second level is provided to the control signal S1 during a period in which the frame start signal is at the first level. Furthermore, a first level is provided to the cascade input terminal of the shift register unit corresponding to the pixel row of the second row during the period in which the pixel row of the first row is scanned and outputted. In this case, the input of the frame start signal is blocked, so an additional signal input is required to enable the shift register units other than the first stage to perform the cascade output and the scan output normally. The case where it is necessary to skip the refreshing of a plurality of continuous pixel rows including the first row can be deduced by analogy.

Figure 6:
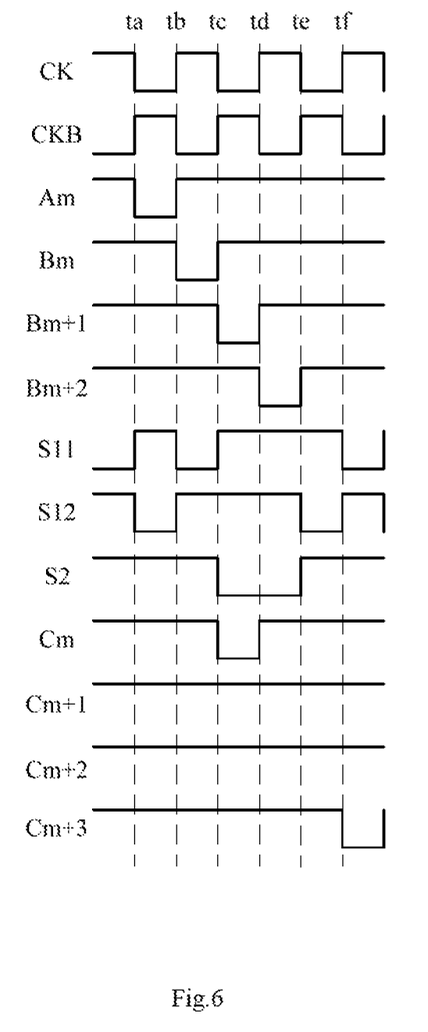
FIG. 6 is a circuit timing diagram of a scan driving circuit according to one embodiment of the present disclosure.
Figure 7:
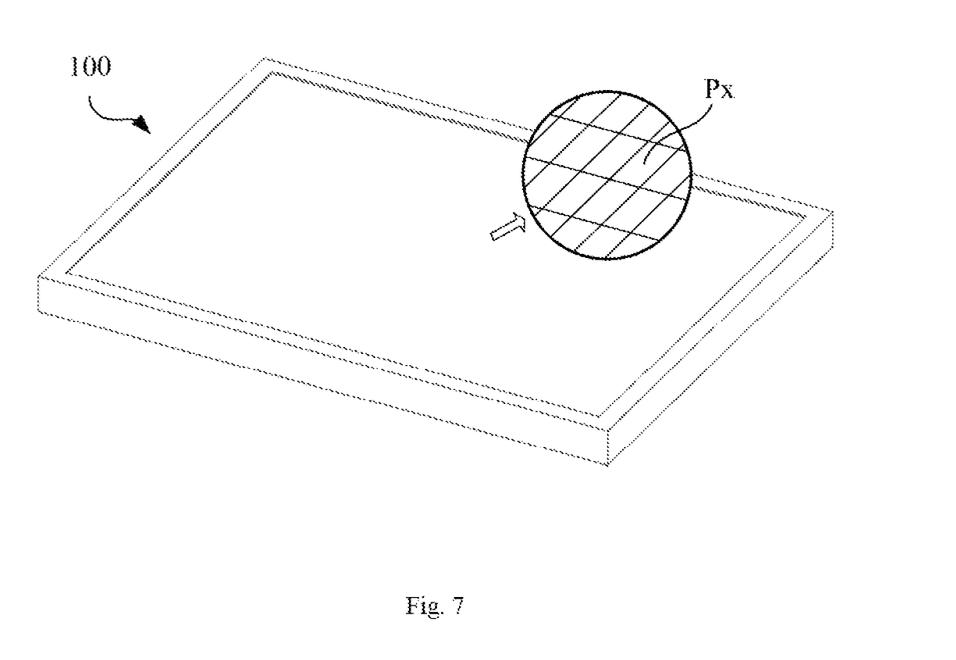
FIG. 7 is a schematic structural diagram of a display apparatus according to one embodiment of the present disclosure.

FIG. 6 is a circuit timing diagram of a scan driving circuit according to one embodiment of the present disclosure. In the present example, the control signal S1 includes a first control signal S11 and a second control signal S12 (the first control signal S11 and the second control signal S12 shown in FIG. 6 are both examples). In the above driving method, the step of providing the control signal to each of the shift register units in the scan driving circuit may include providing a first control signal to the shift register units of odd-numbered stages in each of the scan driving circuits, and providing a second control signal to the shift register units of even-numbered stages in each of the scan driving circuits.

In one embodiment, the first control signal is at a first level in a data writing period corresponding to a previous row of each pixel row that needs to be refreshed, and the first control signal is at a second level in a data writing period corresponding to a previous row of each pixel row that needs to be skipped refreshed. The second control signal is at a first level in a data writing period corresponding to a previous row of each pixel row that needs to be refreshed, and the second control signal is at a second level in a data writing period corresponding to a previous row of each pixel row that needs to be skipped refreshed. The first control signal and the second control signal are inverted signals during a data writing period corresponding to a previous row of each pixel row that needs to be refreshed. As such, the signals are more stable.

Based on the same inventive concept, the driving method of any one of the above shift register units may include: providing a second level to the first control terminal when the first shift circuit supplies a first level to a output terminal thereof to skip refreshing the pixel row corresponding to the shift register unit. It should be understood that the description of the driving method of the above-described scan driving circuit has already included an example of the driving method of the shift register unit, and therefore will not be described herein.

Based on the same inventive concept, one embodiment of the present disclosure provides a display apparatus including the array substrate of any of the above. The display apparatus in the embodiment of the present disclosure may be any product or component having a display function such as a display panel, a mobile phone, a tablet computer, a television, a display, a notebook computer, a digital photo frame, a navigator, and the like. For example, the display apparatus 100 shown in FIG. 7 includes sub-pixel units Px arranged in rows and columns in the display area. The array substrate may be disposed inside the display apparatus 100, and the array substrate may include a pixel circuit in each sub-pixel unit Px to implement adjustment of the display gray scale of each of the sub-pixel units Px. The array substrate may include at least one of the above-described scan driving circuits outside the display area to provide each of the pixel circuits with the required gate scan signal. In one example, the display apparatus may implement refreshing of a portion of the display screen by providing appropriate control signals to the scan drive circuit, thereby helping to reduce power consumption.

The principles and the embodiments of the present disclosure are set forth in the specification. The description of the embodiments of the present disclosure is only used to help understand the apparatus and method of the present disclosure and the core idea thereof. Meanwhile, for a person of ordinary skill in the art, the disclosure relates to the scope of the disclosure, and the technical scheme is not limited to the specific combination of the technical features, but also covers other technical schemes which are formed by combining the technical features or the equivalent features of the technical features without departing from the inventive concept. For example, a technical scheme may be obtained by replacing the features described above as disclosed in this disclosure (but not limited to) with similar features.

What is claimed is:

1. A shift register unit having a cascade input terminal, a cascade output terminal and a scan output terminal, comprising:
   a first shift circuit having an input terminal, an output terminal coupled to the cascade output terminal, a first clock terminal, and a second clock terminal;
   a second shift circuit having an input terminal, an output terminal coupled to the scan output terminal, a first clock terminal, and a second clock terminal;
   an input circuit, coupled between the input terminal of the first shift circuit and the cascade input terminal, the input circuit having an input clock terminal, the input circuit being configured to provide an input signal from the cascade input terminal to the input terminal of the first shift circuit under control of the input clock terminal; and
   a control circuit, coupled between the output terminal of the first shift circuit and the input terminal of the second shift circuit, the control circuit having a first control terminal,
   wherein the control circuit is configured to control connection of the output terminal of the first shift circuit and the input terminal of the second shift circuit based on a signal at the first control terminal; and
   wherein the first shift circuit comprises:
   an output sub-circuit coupled to a pull-up node, an output node, and the second clock terminal of the first shift circuit, the output sub-circuit being configured to connect the output node with the second clock terminal of the first shift circuit under control of the pull-up node; wherein the pull-up node is coupled to the input terminal of the first shift circuit, and the output node is coupled to the output terminal of the first shift circuit;
   a pull-down control sub-circuit respectively coupled to the pull-up node, a pull-down node, and the first clock terminal of the first shift circuit, the pull-down control sub-circuit being configured to connect the first clock terminal of the first shift circuit and the pull-down node under control of the pull-up node, and pull up the pull-down node under control of the first clock terminal of the first shift circuit and a pull-down sub-circuit respectively coupled to the pull-down node, the pull-up node, the output node, and the second clock terminal of the first shift circuit, the pull-down sub-circuit being configured to pull down the output node under control of the pull-down node, and pull down the pull-up node under control of both the pull-down node and the second clock terminal of the first shift circuit.

2. The shift register unit of claim 1, further comprising:
   a reset circuit,
   wherein the reset circuit is coupled to the input terminal of the second shift circuit and a second control terminal, respectively, and the reset circuit is configured to reset the input terminal of the second shift circuit under control of the second control terminal.

3. The shift register unit of claim 2, wherein the reset circuit comprises a second transistor,
a gate of the second transistor is coupled to the second control terminal, a first electrode of the second transistor is coupled to a first signal terminal, and a second electrode of the second transistor is coupled to the input terminal of the second shift circuit;
wherein the first electrode and the second electrode are one of a source and a drain, respectively.

4. The shift register unit of claim 1, wherein the control circuit comprises a first transistor,
a gate of the first transistor is coupled to the first control terminal, a first electrode of the first transistor is coupled to the output terminal of the first shift circuit, and a second electrode of the first transistor is coupled to the input terminal of the second shift circuit,
wherein the first electrode and the second electrode are one of a source and a drain, respectively.

5. The shift register unit of claim 1, wherein the output sub-circuit comprises a third transistor and a first capacitor,
a gate of the third transistor is coupled to the pull-up node,
a first electrode of the third transistor is coupled to the output node, and a second electrode of the third transistor is coupled to the second clock terminal; and
a first electrode of the first capacitor is coupled to the pull-up node, and a second electrode of the first capacitor is coupled to the output node;
wherein the first electrode and the second electrode of the third transistor are one of a source and a drain, respectively.

6. The shift register unit of claim 1, wherein the pull-down control sub-circuit comprises a fourth transistor and a fifth transistor,
a gate of the fourth transistor is coupled to the pull-up node, a first electrode of the fourth transistor is coupled to the first clock terminal of the first shift circuit, and a second electrode of the fourth transistor is coupled to the pull-down node, and
a gate of the fifth transistor is coupled to the first clock terminal, a first electrode of the fifth transistor is coupled to the pull-down node, and a second electrode of the fifth transistor is coupled to a second signal terminal;
wherein the first electrode and the second electrode are one of a source and a drain, respectively.

7. The shift register unit of claim 1, wherein the pull-down sub-circuit comprises a sixth transistor, a seventh transistor, an eighth transistor, and a second capacitor,
a gate of the sixth transistor is coupled to the pull-down node, a first electrode of the sixth transistor is coupled to a the first signal terminal, and a second electrode of the sixth transistor is coupled to the output node,
a gate of the seventh transistor is coupled to the pull-down node, a first electrode of the seventh transistor is coupled to the first signal terminal, and a second electrode of the seventh transistor is coupled to the first electrode of the eighth transistor,
a gate of the eighth transistor is coupled to the second clock terminal of the first shift circuit, and the second electrode of the eighth transistor is coupled to the pull-up node, and
the first electrode of the second capacitor is coupled to the first signal terminal, and the second electrode of the second capacitor is coupled to the pull-down node;

wherein the first electrode and the second electrode of the sixth transistor, seventh transistor, and eighth transistor are one of a source and a drain, respectively.

8. The shift register unit of claim 1, wherein the first shift circuit and the second shift circuit have a same circuit structure.

9. The shift register unit of claim 1, wherein the input circuit comprises a ninth transistor,
a gate of the ninth transistor is coupled to the first clock terminal of the first shift circuit, a first electrode of the ninth transistor is coupled to the input terminal of the input circuit, and a second electrode of the ninth transistor is coupled to the output terminal of the input circuit;
wherein the first electrode and the second electrode are one of a source and a drain, respectively.

10. The shift register unit of claim 1, wherein the first clock terminal of the first shift circuit and the second clock terminal of the second shift circuit and the input clock terminal of the input circuit are coupled to a same clock, and the second clock terminal of the first shift circuit and the first clock terminal of the second shift circuit are coupled to a same clock.

11. A method of driving a shift register unit, wherein the shift register unit having a cascade input terminal, a cascade output terminal, and a scan output terminal comprises:
a first shift circuit having an input terminal, an output terminal coupled to the cascade output terminal, a first clock terminal, and a second clock terminal;
a second shift circuit having an input terminal, an output terminal coupled to the scan output terminal, a first clock terminal, and a second clock terminal;
an input circuit, coupled between the input terminal of the first shift circuit and the cascade input terminal, the input circuit having an input clock terminal, the input circuit being configured to provide an input signal from the cascade input terminal to the input terminal of the first shift circuit under control of the input clock terminal; and
a control circuit, coupled between the output terminal of the first shift circuit and the input terminal of the second shift circuit, the control circuit having a first control terminal, wherein the control circuit is configured to control connection of the output terminal of the first shift circuit and the input terminal of the second shift circuit based on a signal at the first control terminal;
wherein the method comprises:
providing a second level to the first control terminal when the first shift circuit provides a first level to its output terminal, thereby skipping refreshing of a pixel row corresponding to the shift register unit.

12. The method of driving a shift register unit of claim 11, wherein the shift register unit comprises a reset circuit coupled to the input terminal of the second shift circuit and a second control terminal, respectively, the method further comprising providing a reset signal to the second control terminal so that a second level is provided to the input terminal of the second shift sub-circuit.

13. A scan driving circuit, comprising a plurality of stages of shift register units, wherein each of the plurality of stages of the shift register units is a shift register unit,
the shift register unit having a cascade input terminal, a cascade output terminal, and a scan output terminal comprises:
a first shift circuit having an input terminal, an output terminal coupled to the cascade output terminal, a first clock terminal, and a second clock terminal;

a second shift circuit having an input terminal, an output terminal coupled to the scan output terminal, a first clock terminal, and a second clock terminal;

an input circuit, coupled between the input terminal of the first shift circuit and the cascade input terminal, the input circuit having an input clock terminal, the input circuit being configured to provide an input signal from the cascade input terminal to the input terminal of the first shift circuit under control of the input clock terminal; and a control circuit, coupled between the output terminal of the first shift circuit and the input terminal of the second shift circuit, the control circuit having a first control terminal, wherein the control circuit is configured to control connection of the output terminal of the first shift circuit and the input terminal of the second shift circuit based on a signal at the first control terminal;

in odd-numbered stages of shift register units, the first clock terminal of the first shift circuit and the second clock terminal of the second shift circuit and the input clock terminal of the input circuit are coupled to a first clock signal, and the second clock terminal of the first shift circuit and the first clock terminal of the second shift circuit are coupled to a second clock signal, and in even-numbered stages of shirt register units, the first clock terminal of the first shift circuit and the second clock terminal of the second shift circuit and the input clock terminal of the input circuit are coupled to the second clock signal, and the second clock terminal of the first shift circuit and the first clock terminal of the second shift circuit are coupled to the first clock signal.

14. The scan driving circuit of claim 13, wherein the cascade input terminal of the shift register unit of any one of the stages other than the first stage is coupled to the cascade output terminal of the shift register unit of the previous stage.

15. A driving method of the scan driving circuit of claim 13, the method comprising:

providing a control signal to the first control terminal of each of the shift register units;

wherein the control signal is at a first level in a corresponding data writing period of a previous row of each pixel row that needs to be refreshed, and the control signal is at a second level in a corresponding data writing period of a previous row of each pixel row that needs to be skipped refreshed.

16. The driving method of claim 15, wherein the control signal comprises a first control signal and a second control signal, and providing the control signal to each of the shift register units in the scan driving circuit comprises:

providing the first control signal to the shift register units of odd-numbered stages in each of the scan driving circuits, and providing the second control signal to the shift register units of even-numbered stages in each of the scan driving circuit;

wherein the first control signal and the second control signal are inverted signals during a data writing period corresponding to a previous row of each pixel row that needs to be refreshed.

17. A display apparatus comprising the scan driving circuit of claim 13.

* * * * *